United States Patent
Kimoto

(10) Patent No.: US 12,490,579 B2
(45) Date of Patent: Dec. 2, 2025

(54) LIGHT-EMITTING ELEMENT, LIGHT-EMITTING DEVICE, AND DISPLAY DEVICE

(71) Applicant: SHARP KABUSHIKI KAISHA, Sakai (JP)

(72) Inventor: Kenji Kimoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 372 days.

(21) Appl. No.: 18/038,302

(22) PCT Filed: Nov. 27, 2020

(86) PCT No.: PCT/JP2020/044292
§ 371 (c)(1),
(2) Date: May 23, 2023

(87) PCT Pub. No.: WO2022/113287
PCT Pub. Date: Jun. 2, 2022

(65) Prior Publication Data
US 2024/0099048 A1    Mar. 21, 2024

(51) Int. Cl.
*H10K 50/816* (2023.01)
*H10H 20/816* (2025.01)
*H10H 20/832* (2025.01)
*H10H 29/80* (2025.01)
*H10K 50/14* (2023.01)
*H10K 50/826* (2023.01)
*H10K 50/85* (2023.01)

(52) U.S. Cl.
CPC ......... *H10K 50/816* (2023.02); *H10H 20/816* (2025.01); *H10H 20/832* (2025.01); *H10H 29/8322* (2025.01); *H10K 50/14* (2023.02); *H10K 50/826* (2023.02); *H10K 50/85* (2023.02)

(58) Field of Classification Search
CPC ............. H10H 20/832; H10H 29/8322; H10H 20/816–8162; H10K 58/816; H10K 50/826; H10K 50/14–167
See application file for complete search history.

(56) References Cited

U.S. PATENT DOCUMENTS

| 2010/0108984 A1 | 5/2010 | Cho et al. |
| 2010/0283046 A1 | 11/2010 | Uchida |
| 2014/0084280 A1 | 3/2014 | Chiba et al. |

(Continued)

FOREIGN PATENT DOCUMENTS

| JP | S5447590 A | 4/1979 |
| JP | 2004063408 A | 2/2004 |

(Continued)

*Primary Examiner* — Amar Movva
(74) *Attorney, Agent, or Firm* — ScienBiziP, P.C.

(57) ABSTRACT

A light-emitting element includes a first electrode, a second electrode, a light-emitting layer between the first electrode and the second electrode, and an intervening layer between the first electrode and the light-emitting layer, the intervening layer containing an oxide. The first electrode includes: a first layer adjacent to the intervening layer, the first layer containing atoms of a first metal element; and a second layer containing atoms of a second metal element, the first layer and the second layer are stacked in a stated order when viewed from the light-emitting layer, and the second metal element is more susceptible to oxidation than the first metal element.

19 Claims, 9 Drawing Sheets

(56) References Cited

U.S. PATENT DOCUMENTS

| | | |
|---|---|---|
| 2017/0069664 A1 | 3/2017 | Nakamura et al. |
| 2018/0069025 A1 | 3/2018 | Nakamura et al. |

FOREIGN PATENT DOCUMENTS

| | | |
|---|---|---|
| JP | 2010114079 A | 5/2010 |
| JP | 2017054112 A | 3/2017 |
| WO | 2009084273 A1 | 7/2009 |
| WO | 2012160714 A1 | 11/2012 |

OXYGEN DIFFUSES CRYSTAL GRAIN BOUNDARIES 11
(GRAIN BOUNDARY DIFFUSION) TO OXIDIZE SECOND LAYER 62

OXYGEN DIFFUSES CRYSTAL GRAIN BOUNDARIES 11
(GRAIN BOUNDARY DIFFUSION) TO OXIDIZE SECOND LAYER 62

LIGHT-EMITTING ELEMENT, LIGHT-EMITTING DEVICE, AND DISPLAY DEVICE

TECHNICAL FIELD

The disclosure relates to light-emitting elements, light-emitting devices, and display devices.

BACKGROUND ART

Light-emitting elements are known that include: a first electrode; a second electrode; a light-emitting layer between the first electrode and the second electrode; and an oxide-containing, carrier transport layer (intervening layer) between the first electrode and the light-emitting layer.

Patent Literature 1 discloses an example of such a light-emitting element.

CITATION LIST

Patent Literature

Patent Literature 1: Japanese Unexamined Patent Application Publication, Tokukai, No. 2010-114079

SUMMARY

Technical Problem

The first electrode is susceptible to oxidation at the interface of the first electrode and the oxide-containing, carrier transport layer. The oxidation of the first electrode disrupts the transport of carriers between the first electrode and the carrier transport layer, which could undesirably lower the luminous efficiency of the light-emitting element.

The disclosure, in an aspect thereof, has an object to provide, for example, a light-emitting element with a high luminous efficiency.

Solution to Problem

The disclosure, in an aspect thereof, is directed to a light-emitting element including: a first electrode; a second electrode; a light-emitting layer between the first electrode and the second electrode; and an intervening layer between the first electrode and the light-emitting layer, the intervening layer containing an oxide, wherein the first electrode includes: a first layer adjacent to the intervening layer, the first layer containing atoms of a first metal element; and a second layer containing atoms of a second metal element, the first layer and the second layer are stacked in a stated order when viewed from the light-emitting layer, and the second metal element is more susceptible to oxidation than the first metal element.

The disclosure, in an aspect thereof, is directed to a light-emitting element including: a first electrode; a second electrode; a light-emitting layer between the first electrode and the second electrode; and an intervening layer between the first electrode and the light-emitting layer, the intervening layer containing an oxide, wherein the first electrode is adjacent to the intervening layer, the first electrode contains either an alloy of the first metal element and the second metal element or a mixture of the first metal element and the second metal element, and the second metal element is more susceptible to oxidation than the first metal element.

Advantageous Effects of Invention

The disclosure, in an aspect thereof, can provide, for example, a light-emitting element with a high luminous efficiency.

DESCRIPTION OF EMBODIMENTS

Figure 1:
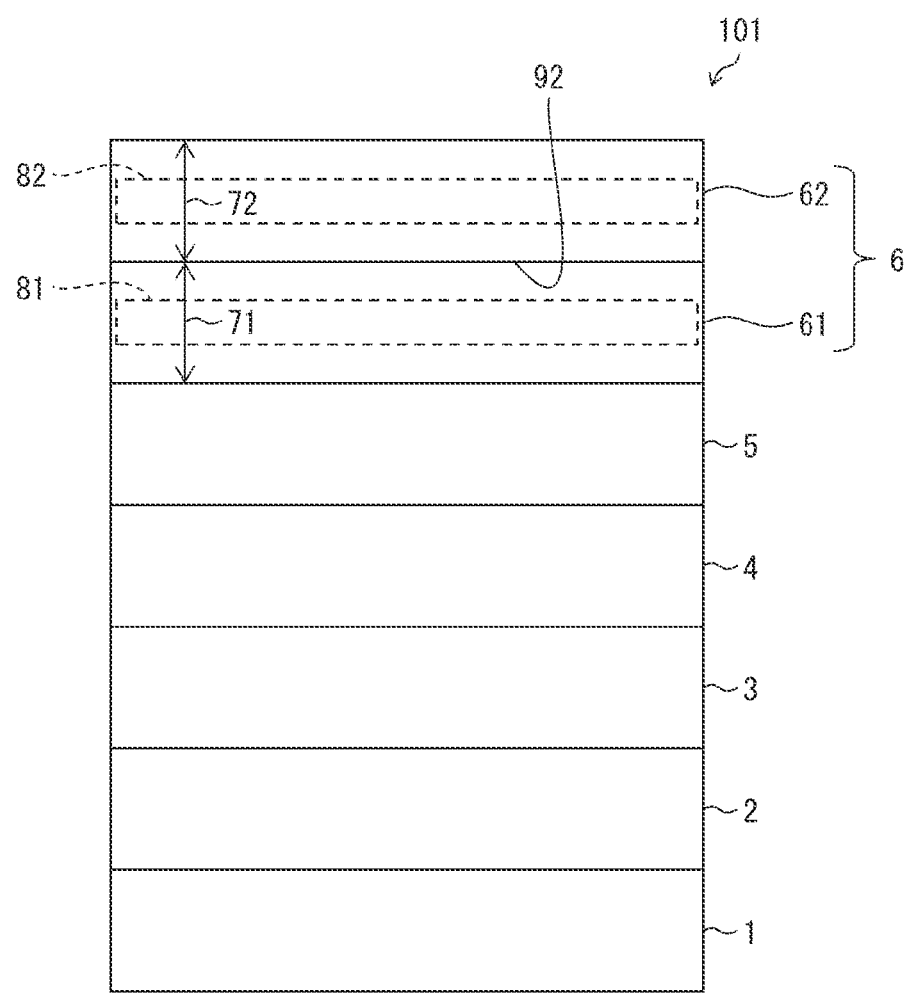
FIG. 1 is a schematic cross-sectional view of a structure of a light-emitting element in accordance with Embodiment 1 of the disclosure.

The following will describe embodiments of the disclosure. For convenience of description, those members which have the same function as previously described members will be indicated by the same reference numerals, and description thereof may not be repeated. Various composition formulae that are given below accompanying names of compounds are mere examples and may be replaced by those where the constituent atoms have a different ratio.

Embodiment 1

FIG. 1 is a schematic cross-sectional view of a structure of a light-emitting element 101 in accordance with Embodiment 1 of the disclosure. The light-emitting element 101 includes a substrate 1, a second electrode 2, a hole transport layer 3, a light-emitting layer 4, an electron transport layer (intervening layer, carrier transport layer) 5, and a first electrode 6.

Throughout the specification of the present application, a "layer" not only refers to a member shaped like a film with a substantially uniform thickness across a face thereof, but may also refer to a member with a structure where the film-shaped member is not strictly continuous (e.g., a structure where the film-shaped member is partially discontinuous). Additionally, throughout the specification of the present application, a "layer" may also refer to such a member that a film-shaped member can be observed that has a thickness across a portion under observation. In addition, throughout the specification of the present application, a "layer" may also refer to those which are describable by two-dimensional components and a thickness component.

The light-emitting element 101 has a structure where the substrate 1, the second electrode 2, the hole transport layer 3, the light-emitting layer 4, the electron transport layer 5, and the first electrode 6 are stacked in this order. In other words, the light-emitting layer 4 is disposed between the first electrode 6 and the second electrode 2, and the electron transport layer 5 is disposed between the first electrode 6 and the light-emitting layer 4.

The electron transport layer 5 contains an oxide. Throughout the specification of the present application, "containing an oxide" means that the substance of interest contains a compound of oxygen and either a metal element or a semimetal element. Examples of semimetals containing this semimetal element include boron, silicon, germanium, arsenic, antimony, bismuth, and tellurium.

The first electrode 6 includes a first layer 61 and a second layer 62. The first layer 61 is disposed next (adjacent) to the electron transport layer 5 and contains atoms of a first metal element. The second layer 62 contains atoms of a second metal element. The first layer 61 and the second layer 62 are stacked in this order when viewed from the light-emitting layer 4.

Throughout the specification of the present application, "contact" (which will be described later in detail) refers to a condition where two objects are in direct contact with each other, in other words, a condition where no object is interposed at all between two objects. In contrast, throughout the specification of the present application, "adjacent" or "next" not only refers to a condition that fits to the term "contact" as it is used in the specification of the present application, but also refers to a condition where an object that is so thin that the thickness thereof is practically ignorable (e.g., thin film) is interposed between two objects.

The second metal element is more susceptible to oxidation than the first metal element.

This configuration facilitates oxidation of the second layer 62 relatively to oxidation of the first layer 61, thereby being capable of restraining oxidation of the first layer 61. In other words, the configuration can restrain oxidation of the electron transport layer 5 side of the first electrode 6. Consequently, decreases in carrier transport efficiency can be restrained between the electron transport layer 5 and the first electrode 6, which in turn enables provision of the light-emitting element 101 with high luminous efficiency.

The electron transport layer 5 transports electrons from the first electrode 6 to the light-emitting layer 4. The electron transport layer 5 may be made of an inorganic oxide. In other words, the oxide contained in the electron transport layer 5 may be an inorganic oxide. The electron transport layer 5 is made primarily of, for example, zinc oxide (e.g., ZnO). Apart from zinc oxide, the electron transport layer 5 may be made primarily of a titanium oxide (e.g., $TiO_2$) or strontium titanium oxide (e.g., $SrTiO_3$). The oxide contained in the electron transport layer 5 may be nanoparticles, but not necessarily be nanoparticles. The electron transport layer 5 may be a mixture of an oxide and an organic material. If the oxide contained in the electron transport layer 5 is nanoparticles, the electron transport layer 5 contains more cavities than when that oxide is shaped like a film (a continuous film). Since these cavities readily contain oxygen, the electron transport layer 5 is likely to produce oxygen. In other words, the oxidation restraining effect on the first layer 61 by the light-emitting element 101 is pronounced, which is highly effective. In addition, when the oxide contained in the electron transport layer 5 is nanoparticles, organic ligands containing oxygen atoms are often coordinated to the surface of these nanoparticles. If organic ligands containing oxygen atoms are coordinated to the surface of the nanoparticles, the electron transport layer 5 produces more oxygen than when the oxide is shaped like a film (continuous film). In other words, the oxidation restraining effect on the first layer 61 by the light-emitting element 101 is pronounced, which is highly effective.

Throughout the specification of the present application, "nanoparticles" refers to particles with a nanometer-sized maximum width (from 1 nm inclusive to 1 μm exclusive).

The electron transport layer 5 can be described as containing oxygen atoms in an end region on the first electrode 6 side of the electron transport layer 5 and in an end region on the light-emitting layer 4 side of the electron transport layer 5. In addition, the electron transport layer 5 can be described as containing the oxide in an end region on the first electrode 6 side of the electron transport layer 5 and in an end region on the light-emitting layer 4 side of the electron transport layer 5.

In the light-emitting element 101, the electron transport layer 5 and the first layer 61 are in contact with each other, and the first layer 61 and the second layer 62 are in contact with each other. It should be noted however that in the light-emitting element 101, the electron transport layer 5 and the first layer 61 are not necessarily in contact with each other, and the first layer 61 and the second layer 62 are not necessarily in contact with each other. For instance, a thin film may be interposed between the electron transport layer 5 and the first layer 61 and/or between the first layer 61 and the second layer 62.

Note that when the boundary between the first layer 61 and the second layer 62 is not clear, the first layer 61 and the second layer 62 may be distinguished from the following two perspectives. A first perspective is that the second layer 62 contains more atoms of the second metal element than the first layer 61. A second perspective is that the second metal element has a higher density of atoms in a center 82 of the second layer 62 with respect to a thickness direction 72 than in a center 81 of the first layer 61 with respect to a thickness direction 71.

The first metal element, whose atoms are contained in the first layer 61, preferably contains any one of Au, Ag, and Cu. These materials have high reflectance to visible light. Therefore, the light extraction efficiency of the light-emitting element 101 can be increased by making up the first layer 61 from any one of these materials. In addition, the most numerous metal atoms in those metal atoms which make up the first layer 61 are more preferably atoms of the first metal element. This particular configuration can further increase the light extraction efficiency.

The second metal element, whose atoms are contained in the second layer 62, is more susceptible to oxidation than the first metal element. Specifically, an oxide of the second metal element has a lower standard Gibbs energy of formation per 2 mol of oxygen atoms than an oxide of the first metal element. Examples of the second metal element include Bi, Pb, Ni, Co, Mo, Cd, Mn, Fe, W, Sn, Ge, In, Zn, Cr, Nb, V, Ta, Si, Ti, Ce, Zr, Al, Hf, Mg, Nd, Pr, Gd, Y, and Sc.

The most numerous metal atoms in those metal atoms which make up the second layer 62 are preferably atoms of the second metal element. The most numerous atoms in those atoms which make up the second layer 62 are more preferably atoms of the second metal element. The second layer 62 is more susceptible to oxidation than the first layer 61. Therefore, if the first electrode 6 is oxidized by the oxygen in the electron transport layer 5, the second layer 62 is oxidized before the first layer 61. Oxidation of the first layer 61 can be hence restrained. Note that examples of the oxygen in the electron transport layer 5 include those oxygen atoms which are a component of the oxide contained in the electron transport layer 5 and those oxygen molecules which are contained between crystal particles of this oxide.

This particular configuration can lower contact resistance between the first electrode 6 (first layer 61) and the electron transport layer 5. In addition, if the first electrode 6 is light-reflective, the first electrode 6 can provide a high reflectance. The second layer 62 may be oxidized (may contain oxygen atoms) and may contain an oxide of the second metal element as a result of this oxidation. In contrast, the second layer 62 contains the second metal element that is not oxidized. In the second layer 62, the ratio of the number of oxygen atoms to the number of the atoms of the second metal element is preferably less than or equal to 30%, more preferably less than or equal to 10%, and even more preferably less than or equal to 5%. The smaller this ratio is, the better long-term reliability the second layer 62 can provide.

In addition, in the light-emitting element 101, the oxygen atoms in the second layer 62 have a higher number density in an end region 92 on the electron transport layer 5 side of the second layer 62 than in the center 82 of the second layer 62 with respect to the thickness direction 72. In such a case, the oxygen in the electron transport layer 5 is efficiently directed to the second layer 62. It is understood that the oxidation restraining effect on the first layer 61 is effective.

The second metal element preferably has a work function larger than 3.7 eV Metals with a work function smaller than or equal to 3.7 eV are not preferred as the second metal element because these metals can readily react with atmospheric oxygen and water. The second metal element having a work function larger than 3.7 eV enables the second layer 62 to be readily formed, thereby providing the second layer 62 which is highly reliable. The second metal element more preferably has a work function larger than or equal to 4.0 eV With the work function being larger than 3.7 eV as a condition, examples of the second metal element include Bi, Pb, Ni, Co, Mo, Cd, Mn, Fe, W, Sn, Ge, In, Zn, Cr, Nb, V, Ta, Si, Ti, Zr, Al, and Hf. With the work function being larger than or equal to 4.0 eV as a condition, examples of the second metal element include Bi, Pb, Ni, Co, Mo, Cd, Mn, Fe, W, Sn, Ge, In, Cr, V, Ta, Si, Ti, Zr, and Al.

The second metal element preferably has a melting point higher than or equal to 160° C. Metals with a melting point below 160° C. could melt in the manufacture of the light-emitting element 101 (e.g., in the baking step, the vapor deposition step, and the sputtering step in the formation of a coating film) and react with layers other than the second layer 62. The second metal element having a melting point higher than or equal to 160° C. enables the second layer 62 to be readily formed. Note that the second metal element more preferably has a melting point higher than or equal to 200° C. and even more preferably higher than or equal to 300° C. With the melting point being higher than or equal to 160° C. as a condition, examples of the second metal element include Bi, Pb, Ni, Co, Mo, Cd, Mn, Fe, W, Sn, Ge, Zn, Cr, Nb, V, Ta, Si, Ti, Ce, Zr, Al, Hf, Mg, Nd, Pr, Gd, Y, and Sc.

With the work function being larger than 3.7 eV and the melting point higher than or equal to 160° C. as conditions, examples of the second metal element include Bi, Pb, Ni, Co, Mo, Cd, Mn, Fe, W, Sn, Ge, Zn, Cr, Nb, V, Ta, Si, Ti, Zr, Al, and Hf.

If the first metal element is Au or Ag, the second metal element may be Pd or Cu. In other words, if the first metal element is Au or Ag, the aforementioned examples of the second metal element may include Pd and Cu as additional options.

The oxide in the second metal element preferably has a standard Gibbs energy of formation greater than or equal to −1,000 kJ per 2 mol of oxygen atoms. In such a case, the second metal element is not readily oxidized in air. Therefore, the second layer 62 can be readily formed, and the oxidation restraining effect on the first layer 61 can be readily obtained. The oxide in the second metal element having a standard Gibbs energy of formation greater than or equal to −1,000 kJ per 2 mol of oxygen atoms is a condition. Examples of the second metal element which satisfy this condition include Bi, Pb, Ni, Co, Mo, Cd, Mn, Fe, W, Sn, Ge, In, Zn, Cr, Nb, V, Ta, Si, and Ti.

The work function being larger than 3.7 eV, the melting point being higher than or equal to 160° C., and the oxide in the second metal element having a standard Gibbs energy of formation greater than or equal to −1,000 kJ per 2 mol of oxygen atoms are conditions. Examples of the second metal element which satisfy these conditions include Bi, Pb, Ni, Co, Mo, Cd, Mn, Fe, W, Sn, Ge, Zn, Cr, Nb, V, Ta, Si, and Ti.

The second metal element may be any of Ti, Zn, Sn, and Ni. This particular configuration ensures electrical conductivity even if most of the second layer 62 is oxidized due to a long-term operation of the light-emitting element 101 or changes of the light-emitting element 101 over time. The configuration can hence reduce, for example, the undesirable possibility of failing to establish electrical connections between the second layer 62 and external wiring (not shown).

The second layer 62 may be made of an alloy of the first metal element and the second metal element. In other words, the second layer 62 may contain both atoms of the first metal element and atoms of the second metal element.

Current flows in the light-emitting layer 4 from the second electrode 2 to the first electrode 6, which causes the light-emitting layer 4 to emit light. The light-emitting layer 4 includes, for example, a fluorescent material made primarily of quantum dots (which may, hereinafter, be referred to as a "quantum-dot fluorescent material") or an organic EL (electroluminescence) fluorescent material.

Throughout the specification of the present application, "quantum dots" refers to dots with a maximum width of from 1 nm to 100 nm both inclusive. The shape the quantum dots is not limited in any particular manner as long as the shape satisfies the aforementioned maximum width and is not necessarily spherical (cross-section is circular). The quantum dots may be shaped like, for example, a polygon in cross section, a bar, or a branch, may have an irregular surface, or may have a combination of these shapes.

The hole transport layer 3 transports holes from the second electrode 2 to the light-emitting layer 4. Examples of the hole transport layer 3 include PEDOT:PSS, PVK, TFB, NPD, NiO, $Cu_2O$, and $CuAlO_2$.

Either one or both of the first electrode 6 and the second electrode 2 is transmissive to light. If the first electrode 6 is transmissive to light, the second electrode 2 may be made of a light-reflective material. Examples of such a light-reflective material include Al, Au, Ag, and Cu. If the first electrode 6 is not transmissive to light, the second electrode 2 may be made of a light-transmissive material. If the first electrode 6 is reflective to light, the second electrode 2 may be made of a light transmissive material. Examples of such a light transmissive material include ITO, tin oxide, and zinc oxide.

The first layer 61 and the second layer 62 can be formed by a publicly known film formation method. Examples of such a publicly known film formation method include sputtering and vapor deposition.

In the light-emitting element 101, the electron transport layer 5 is an example of the intervening layer. A viable example of the intervening layer other than the electron transport layer 5 is a stack of the electron transport layer 5 and another thin film (e.g., an electron injection layer and an electron-tunneling layer). Other viable examples of the intervening layer other than the electron transport layer 5 include: a layer that does not have an electron-transporting function, but contains an oxide and hence allows transport of electrons (e.g., electron-tunneling layer); and a stack of such a layer that allows transport of electrons and another thin film.

Figure 2:
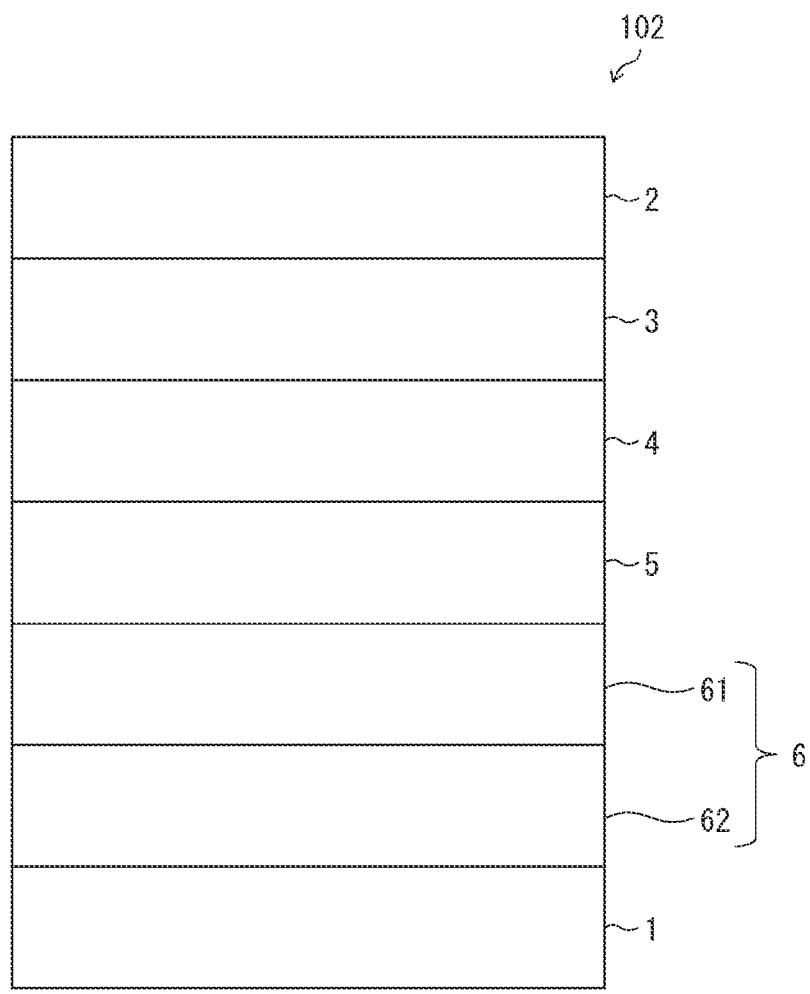
FIG. 2 is a schematic cross-sectional view of a structure of a light-emitting element in accordance with a variation example of Embodiment 1 of the disclosure.

FIG. 2 is a schematic cross-sectional view of a structure of a light-emitting element 102 in accordance with a variation example of Embodiment 1 of the disclosure. The light-emitting element 102 includes the substrate 1, the first electrode 6, the electron transport layer 5, the light-emitting layer 4, the hole transport layer 3, and the second electrode 2, all of which are stacked in this order. In other words, when the light-emitting element 102 is compared with the light-emitting element 101 shown in FIG. 1, the order of stacking of the second electrode 2, the hole transport layer 3, the light-emitting layer 4, the electron transport layer 5, and the first electrode 6 on the substrate 1 is reversed.

In other words, in the light-emitting element 101, the order of stacking the second electrode 2, the hole transport layer 3, the light-emitting layer 4, the electron transport layer 5, and the first electrode 6 may be reversed.

Figure 3:
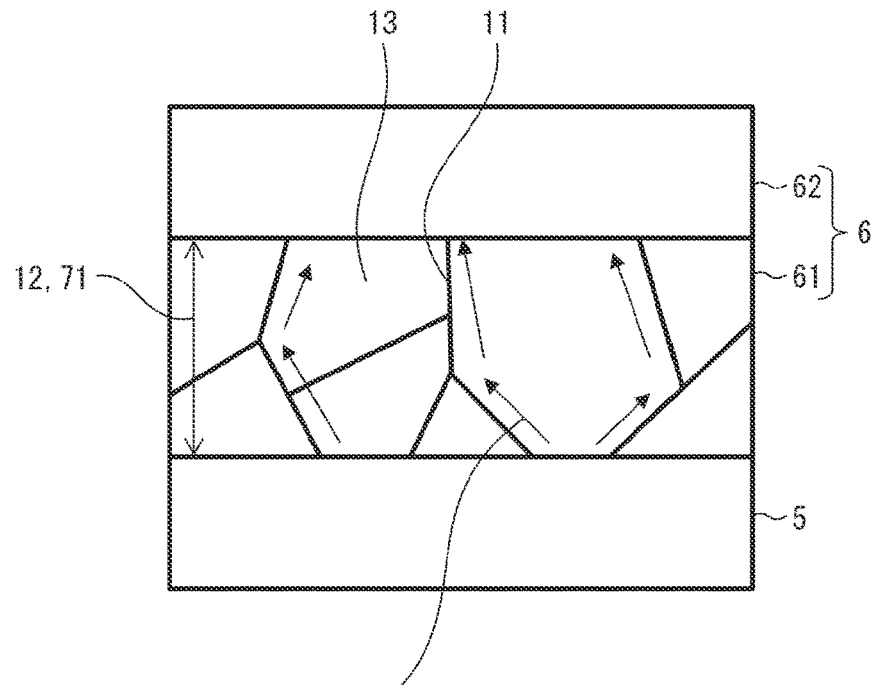
FIG. 3 is a cross-sectional view of an electron transport layer and a first electrode in the light-emitting element shown in FIG. 1.
Figure 4:
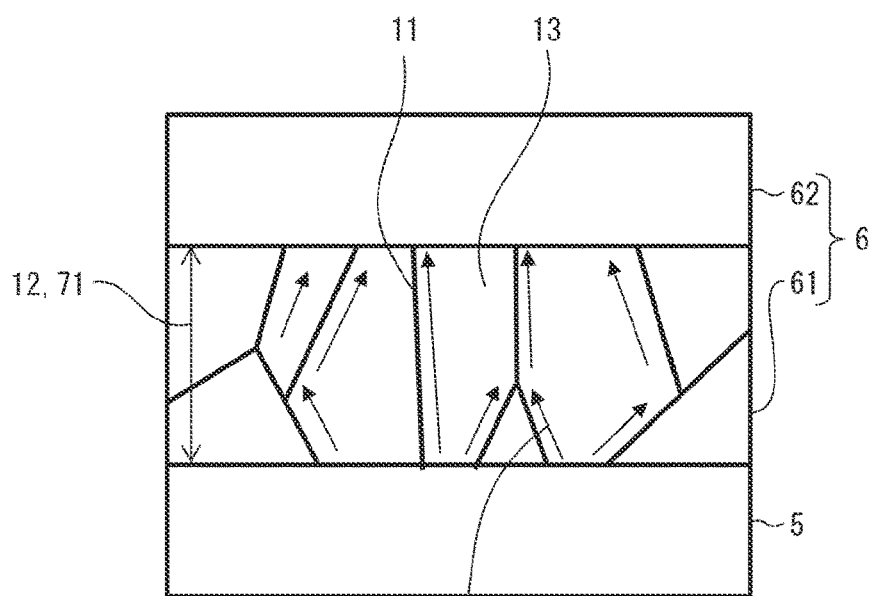
FIG. 4 is a cross-sectional view of the electron transport layer and the first electrode in the light-emitting element shown in FIG. 1.

FIGS. 3 and 4 are cross-sectional views of the electron transport layer 5 and the first electrode 6 respectively of the light-emitting element 101. FIGS. 3 and 4 show the cross-sectional structure of the first layer 61 in more detail than the cross-sectional structures of the electron transport layer 5 and the second layer 62.

The oxygen in the electron transport layer 5 diffuses crystal grain boundaries 11 in the first layer 61 (grain boundary diffusion) and reaches the second layer 62. Since the second layer 62 is more susceptible to oxidation than the first layer 61, the second layer 62 is more preferentially oxidized than the first layer 61. Note that although oxygen is described here as diffusing by grain boundary diffusion, this is not the only mechanism by which oxygen can diffuse.

In the light-emitting element 101, oxidation of the first layer 61 is thermodynamically more stable than oxidation of the second layer 62, and for this reason, the condition of the first electrode 6 changes toward oxidation of the second layer 62. Therefore, although oxygen may not diffuse at the same speed throughout the first layer 61, the light-emitting element 101 can restrain oxidation of the first layer 61.

Throughout the specification of the present application, "metal A being more susceptible to oxidation than metal B" regarding two metals A and B means that $2X/n < 2Y/h$ at some temperature, where $X$ (J/mol) is the standard Gibbs energy of formation of an oxide $A_mO_n$ (m and n are natural numbers) of metal A, and $Y$ (J/mol) is the standard Gibbs energy of formation of an oxide $B_kO_h$ (k and h are natural numbers) of metal B.

In other words, the oxide $A_mO_n$ of metal A has a lower standard Gibbs energy of formation per 2 mol of oxygen atoms than the oxide $B_kO_h$ of metal B.

Note that both X and Y have a negative value. In addition, "some temperature" refers to any temperature of, for example, from 25° C. to 300° C. both inclusive.

Additionally, the oxide $A_mO_n$ of metal A is stoichiometry (stoichiometric composition). If there exist more than one stable composition for the oxide $A_mO_n$ of metal A at some temperature, the composition that has a lower standard Gibbs energy of formation per 2 mol of oxygen atoms is employed.

Additionally, the oxide $B_kO_h$ of metal B is stoichiometry (stoichiometric composition). If there exist more than one stable composition for the oxide $B_kO_h$ of metal B at some temperature, the composition that has a lower standard Gibbs energy of formation per 2 mol of oxygen atoms is employed.

In the light-emitting element 101, the first electrode 6 may be used as either a light-reflective electrode or a light-transmissive electrode.

(1) First Electrode 6 as Light-Reflective Electrode

Light is extracted on the second electrode 2 side of the light-emitting element 101. Here, the first electrode 6 has a high reflectance to the light that comes through the electron transport layer 5 side, and contact resistance is low between the first layer 61 and the electron transport layer 5. In other words, the oxidation restraining effect on the first layer 61 by the second layer 62 is suitably obtained.

The first layer 61 has a thickness of preferably from 50 nm to 800 nm both inclusive and more preferably from 100 nm to 500 nm both inclusive. If the first layer 61 has an excessively small thickness, the optical reflectance of the first electrode 6 could undesirably fall (the optical transmittance could rise). If the first layer 61 has an excessively large thickness, the oxidation restraining effect on the first layer 61 by the second layer 62 could be undesirably insufficient.

The thickness of the second layer 62 is preferably from 1 nm to 100 nm both inclusive, more preferably from 5 nm to 50 nm both inclusive, even more preferably from 10 nm to 40 nm both inclusive, and most preferably from 20 nm to 40 nm both inclusive. If the second layer 62 has an excessively small thickness, the oxidation restraining effect on the first layer 61 by the second layer 62 could be undesirably insufficient. If the second layer 62 has an excessively large thickness, the second layer 62 could undesirably contain too many non-oxidized portions, in other words, the material of the second layer 62 could be undesirably wasted.

(2) First Electrode 6 as Light-Transmissive Electrode

Light is extracted on the first electrode 6 side of the light-emitting element 101.

The first layer 61 has a thickness of preferably from 1 nm to 50 nm both inclusive and more preferably from 5 nm to 30 nm both inclusive. Here, the first layer 61 has a high optical transmittance, and contact resistance is low between the first layer 61 and the electron transport layer 5. In other words, the oxidation restraining effect on the first layer 61 by the second layer 62 is suitably obtained.

The thickness of the second layer 62 is preferably from 1 nm to 10 nm both inclusive. Here, the oxidation restraining effect on the first layer 61 by the second layer 62 is suitably obtained, and the second layer 62 has a high optical transmittance. If the second layer 62 has an excessively small thickness, the oxidation restraining effect on the first layer 61 by the second layer 62 could be undesirably insufficient. If the second layer 62 has an excessively large thickness, the optical transmittance of the second layer 62 could undesirably fall, and the light extraction efficiency of the light-emitting element 101 could undesirably fall.

If the most numerous metal atoms in those metal atoms which make up the oxide contained in the electron transport layer 5 are atoms of a third metal element, the second metal element is more preferably more susceptible to oxidation than the first metal element and less susceptible to oxidation than the third metal element. Here, the second metal element reduces the oxide in the electron transport layer 5, which prevents deposition of the third metal element as an elementary substance, even if the light-emitting element 101 is subjected to harsh conditions such as a high-temperature thermal process or operation over an extended period of time. Therefore, the reliability of the light-emitting element 101 can be improved.

When the third metal element is Zn, and the first metal element is Ag, examples of the second metal element include Pd, Cu, Bi, Pb, Ni, Co, Mo, Cd, Mn, Fe, W, Sn, and Ge.

When the third metal element is Ni, and the first metal element is Ag, examples of the second metal element include Pd, Cu, Bi, and Pb.

The first layer 61 has the crystal grain boundaries 11 formed therein and hence contains crystal domains. In a direction 12 in which the electron transport layer 5 is connected to the second layer 62 by the shortest possible distance, the crystal domains have a dimension of effectively from 50 nm to 800 nm both inclusive and more effectively from 100 nm to 500 nm both inclusive. The crystal grain boundaries 11 preferably extend through the first layer 61 in the thickness direction 71 because the grain boundary diffusion of oxygen is highly facilitated. In other words, crystal particles 13 in the first layer 61 preferably reach from the upper end surface of the first layer 61 to the lower end surface of the first layer 61 (the crystal domains have approximately equal dimensions as the thickness of the first layer 61) because the grain boundary diffusion of oxygen is highly facilitated.

Therefore, the crystal domains preferably have, in the direction 12, the same dimension of 50 nm to 800 nm both inclusive as the thickness of the first layer 61 because the grain boundary diffusion of oxygen is highly facilitated. In addition, the crystal domains more preferably have, in the direction 12, the same dimension of 100 nm to 500 nm both inclusive as the more preferred thickness of the first layer 61 because the grain boundary diffusion of oxygen is further and extremely facilitated.

It should be understood that the crystal particles 13 do not necessarily extend through the first layer 61 and may include n' crystal particles 13 in the thickness direction 71 of the first layer 61. The count n' is preferably equal to 1 and may be from 2 to 5 both inclusive because the grain boundary diffusion of oxygen is still highly facilitated. FIGS. 3 and 4 show examples where n' is dominantly equal to 1 or 2. Even if the first layer 61 is amorphous, the first layer 61 is effective because oxygen can diffuse.

In addition, the crystal grain boundaries 11 do not necessarily extend as a single boundary through the first layer 61 in a cross-section taken perpendicular to the first layer 61. Alternatively, m' crystal grain boundaries 11 may be linked from the bottom toward the top to extend as a continuous boundary through the first layer 61. A plurality of crystal grain boundaries 11 may be linked and branched out. The count m' is preferably equal to 1 and may be from 2 to 5 both inclusive because the grain boundary diffusion of oxygen is still highly facilitated. FIGS. 3 and 4 show examples where m' is dominantly equal to 1 or 2.

If the first electrode 6 is used as a light-transmissive electrode, the second electrode 2 may be made of a light-transmissive material. This particular configuration enables light to be extracted on both the first electrode 6 side and the second electrode 2 side of the light-emitting element 101.

The description given above with reference to FIGS. 3 and 4 is equally applicable to the light-emitting element 102.

Embodiment 2

Figure 5:
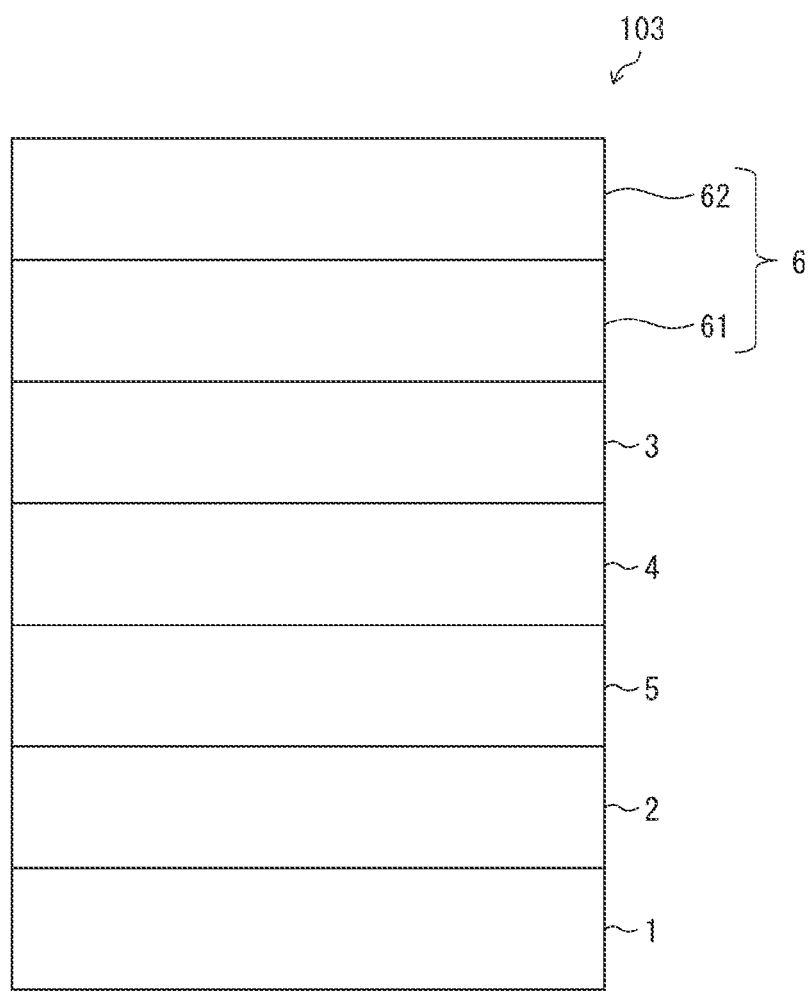
FIG. 5 is a schematic cross-sectional view of a structure of a light-emitting element in accordance with Embodiment 2 of the disclosure.

FIG. 5 is a schematic cross-sectional view of a structure of a light-emitting element 103 in accordance with Embodiment 2 of the disclosure. The light-emitting element 103 includes a substrate 1, a second electrode 2, an electron transport layer 5, a light-emitting layer 4, a hole transport layer (intervening layer, carrier transport layer) 3, and a first electrode 6, all of which are stacked in this order. In other words, the light-emitting element 103 has a structure in which the hole transport layer 3 and the electron transport layer 5 are transposed in the structure of the light-emitting element 101.

The hole transport layer 3 contains an oxide. The first electrode 6 is disposed on the hole transport layer 3. The first layer 61 is disposed next (adjacent) to the hole transport layer 3 between the hole transport layer 3 and the second layer 62. The first layer 61 contains atoms of a first metal element. The second layer 62 contains atoms of a second metal element. The second metal element is more susceptible to oxidation than the first metal element.

The hole transport layer 3 may be made of an inorganic oxide. In other words, the oxide contained in the hole transport layer 3 may be an inorganic oxide. The oxide contained in the hole transport layer 3 may be nanoparticles. In addition, the hole transport layer 3 may be made of an organic material containing the inorganic oxide. The hole transport layer 3 is made primarily of, for example, an organic material (e.g., PEDOT:PSS, PVK, TFB, NPD) containing particles of nickel oxide (e.g., NiO), copper oxide (e.g., $Cu_2O$), copper aluminum oxide (e.g., $CuAlO_2$), or molybdenum oxide or an organic material containing particles of tungsten oxide.

The first metal element preferably contains any one of Au, Ag, and Cu. These materials have high reflectance to visible light. Therefore, the light extraction efficiency of the light-emitting element 103 can be increased by making up the first layer 61 from any one of these materials. In addition, the most numerous metal atoms in those metal atoms which make up the first layer 61 are more preferably atoms of the first metal element. This particular configuration can further increase the light extraction efficiency.

The most numerous metal atoms in those metal atoms which make up the second layer 62 are preferably atoms of the second metal element. The most numerous atoms in those atoms which make up the second layer 62 are more preferably atoms of the second metal element. The second layer 62 is more susceptible to oxidation than the first layer 61. Therefore, if the first electrode 6 is oxidized by the oxygen in the hole transport layer 3, the second layer 62 is oxidized before the first layer 61. Oxidation of the first layer 61 can be hence restrained. Note that examples of the oxygen in the hole transport layer 3 include oxygen atoms which are a component of the oxide contained in the hole transport layer 3 and those oxygen molecules which are contained between crystal particles of this oxide.

This particular configuration can lower contact resistance between the first electrode 6 (first layer 61) and the hole transport layer 3. In addition, if the first electrode 6 is light-reflective, the first electrode 6 can provide high reflectance. The second layer 62 may be oxidized (may contain oxygen atoms) and may contain an oxide of the second metal element as a result of this oxidation. In contrast, the second layer 62 contains the second metal element that is not oxidized. In the second layer 62, the ratio of the number of oxygen atoms to the number of the atoms of the second metal element is preferably less than or equal to 30%, more preferably less than or equal to 10%, and even more preferably less than or equal to 5%. The smaller this ratio is, the better long-term reliability the second layer 62 can provide.

Examples of the second metal element include Bi, Pb, Ni, Co, Mo, Cd, Mn, Fe, W, Sn, Ge, Zn, Cr, Nb, V, Ta, Si, Ti, Zr, Al, and Hf.

If the first metal element is Au or Ag, the second metal element may be Pd or Cu. In other words, if the first metal element is Au or Ag, the aforementioned examples of the second metal element may include Pd and Cu as additional options.

The second metal element may be any of Ti, Zn, Sn, and Ni. This particular configuration ensures electrical conductivity even if most of the second layer 62 is oxidized due to a long-term operation of the light-emitting element 103 or changes of the light-emitting element 103 over time. The configuration can hence reduce, for example, the undesirable possibility of failing to establish electrical connections between the second layer 62 and external wiring (not shown).

If the most numerous metal atoms in those metal atoms which make up the oxide contained in the hole transport layer 3 are atoms of a third metal element, the second metal element is more preferably more susceptible to oxidation than the first metal element and less susceptible to oxidation than the third metal element. Here, the second metal element reduces the oxide in the hole transport layer 3, which prevents deposition of the third metal element as an elementary substance, even if the light-emitting element 103 is subjected to harsh conditions such as a high-temperature thermal process or operation over an extended period of time. Therefore, the reliability of the light-emitting element 103 can be improved.

When the third metal element is Ni, and the first metal element is Ag, examples of the second metal element include Pd, Cu, Bi, and Pb.

Other technical matters regarding the light-emitting element 103 can be explained by referring to technical matters regarding the light-emitting elements 101 and 102 when necessary.

Figure 6:
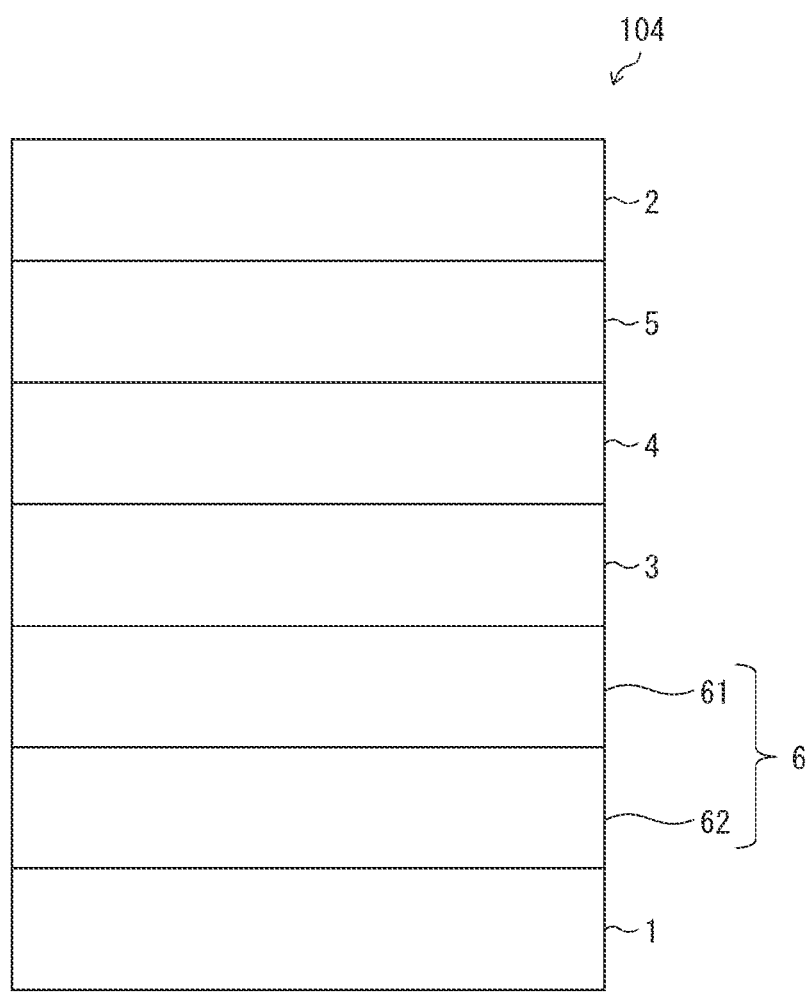
FIG. 6 is a schematic cross-sectional view of a structure of a light-emitting element in accordance with a variation example of Embodiment 2 of the disclosure.

FIG. 6 is a schematic cross-sectional view of a structure of a light-emitting element 104 in accordance with a variation example of Embodiment 2 of the disclosure. The light-emitting element 104 includes the substrate 1, the first electrode 6, the hole transport layer 3, the light-emitting layer 4, the electron transport layer 5, and the second electrode 2, all of which are stacked in this order. In other words, when the light-emitting element 104 is compared with the light-emitting element 103 shown in FIG. 5, the order of stacking of the second electrode 2, the electron transport layer 5, the light-emitting layer 4, the hole transport layer 3, and the first electrode 6 on the substrate 1 is reversed.

In other words, in the light-emitting element 103, the order of stacking of the second electrode 2, the electron transport layer 5, the light-emitting layer 4, the hole transport layer 3, and the first electrode 6 may be reversed.

Other technical matters regarding the light-emitting element 104 can be explained by referring to technical matters regarding the light-emitting elements 101 to 103 when necessary.

Embodiment 3

Figure 7:
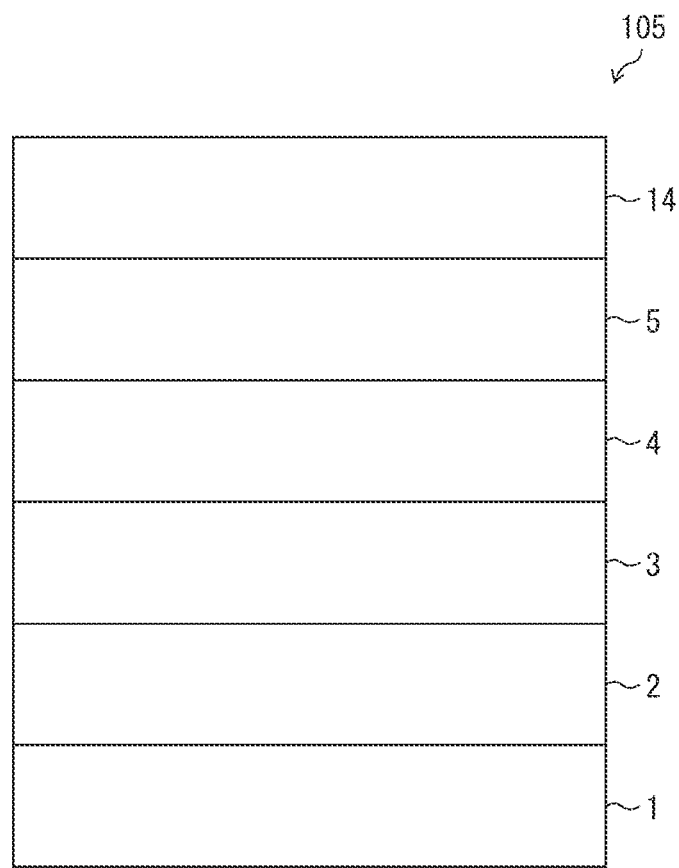
FIG. 7 is a schematic cross-sectional view of a structure of a light-emitting element in accordance with Embodiment 3 of the disclosure.

FIG. 7 is a schematic cross-sectional view of a structure of a light-emitting element 105 in accordance with Embodiment 3 of the disclosure. The light-emitting element 105 includes a substrate 1, a second electrode 2, a hole transport layer 3, a light-emitting layer 4, an electron transport layer (intervening layer, carrier transport layer) 5, and a first electrode 14.

The light-emitting element 105 includes the substrate 1, the second electrode 2, the hole transport layer 3, the light-emitting layer 4, the electron transport layer 5, and the first electrode 14, all of which are stacked in this order. In other words, the light-emitting layer 4 is disposed between the first electrode 14 and the second electrode 2, and the electron transport layer 5 is disposed between the first electrode 14 and the light-emitting layer 4.

The electron transport layer 5 contains an oxide.

The first electrode 14 is disposed next (adjacent) to the electron transport layer 5. The first electrode 14 contains an alloy of the first metal element and the second metal element or a mixture of the first metal element and the second metal element.

The second metal element is more susceptible to oxidation than the first metal element.

This configuration facilitates oxidation of atoms of the second metal element relatively to oxidation of atoms of the first metal element, thereby being capable of restraining oxidation of atoms of the first metal element. The configuration can restrain oxidation of the entire electron transport layer 5 side of the first electrode 14. Consequently, decreases in carrier transport efficiency can be restrained between the electron transport layer 5 and the first electrode 14, which in turn enables provision of the light-emitting element 105 with high luminous efficiency.

The first electrode 14 is disposed on the electron transport layer 5. The electron transport layer 5 may be made of an inorganic oxide. In other words, the oxide contained in the electron transport layer 5 may be an inorganic oxide. The oxide contained in the electron transport layer 5 may be nanoparticles.

The first electrode 14 is made of an alloy or mixture that contains the first metal element and the second metal element which is more susceptible to oxidation than the first metal element.

The first metal element preferably contains any one of Au, Ag, and Cu. These materials have high reflectance to visible light. Therefore, the light extraction efficiency of the light-emitting element 105 can be increased by making up the first electrode 14 from any one of these materials. In addition, the most numerous metal atoms in those metal atoms which make up the first electrode 14 are more preferably atoms of the first metal element. This particular configuration can further increase the light extraction efficiency.

The second metal element is more susceptible to oxidation than the first metal element. Therefore, if the first electrode 14 is oxidized by the oxygen in the electron transport layer 5, the atoms of the second metal element are oxidized before the atoms of the first metal element. Oxidation of the atoms of the first metal element can be hence restrained.

This particular configuration can lower contact resistance between the first electrode 14 and the electron transport layer 5. In addition, if the first electrode 14 is light-reflective, the first electrode 14 can provide high reflectance. The first electrode 14 may be oxidized (may contain oxygen atoms) and may contain an oxide of the second metal element as a result of this oxidation. In contrast, the first electrode 14 contains atoms of the second metal element that is not oxidized. In the first electrode 14, the ratio of the number of oxygen atoms to the number of the atoms of the second metal element is preferably less than or equal to 30%, more preferably less than or equal to 10%, and even more preferably less than or equal to 5%. The smaller this ratio is, the better long-term reliability the first electrode 14 can provide. The ratio of the number of the atoms of the second metal element to the number of the atoms of the first metal element in the first electrode 14 is preferably from 0.1% to 30% both inclusive, more preferably from 0.2% to 10% both inclusive, and more preferably from 1% to 5% both inclusive. The optical reflectance of the first electrode 14 could disadvantageously decrease if the ratio is too large, and the atoms of the first metal element are more susceptible to oxidation if the ratio is too small.

Examples of the second metal element include Bi, Pb, Ni, Co, Mo, Cd, Mn, Fe, W, Sn, Ge, In, Rb, Cs, Zn, K, Ga, Cr, Nb, Na, V, Ta, Si, Ti, Ce, Ba, Zr, Al, Hf, Sr, Li, La, Mg, Nd, Pr, Gd, Ca, Y, and Sc. Examples of the second metal element in the light-emitting element 105 differ from examples of the second metal element in the light-emitting elements 101 to 104 in that the former is highly reactive with air and/or contains a metal with a low melting point.

When the third metal element is Zn, and the first metal element Ag, examples of the second metal element include Bi, Pb, Ni, Co, Mo, Cd, Mn, Fe, W, Sn, Ge, In, Rb, and Cs. These second metal elements are more susceptible to oxidation than Ag and less susceptible to oxidation than Zn. Hence, oxidation of Ag is restrained, and the second metal element reduces zinc oxide in the electron transport layer 5, which prevents deposition of Zn, even if the light-emitting element 105 is subjected to harsh conditions such as a high-temperature thermal process or operation over an extended period of time. Therefore, the reliability of the light-emitting element 105 can be improved.

The second metal element is preferably any of Ti, Zn, Sn, Ni, and In. This particular configuration ensures electrical conductivity even if most of the first electrode 14 is oxidized. The configuration can hence restrain, for example, increases in the resistance of the first electrode 14.

Other technical matters regarding the light-emitting element 105 can be explained by referring to technical matters regarding the light-emitting elements 101 to 104 when necessary.

Figure 8:
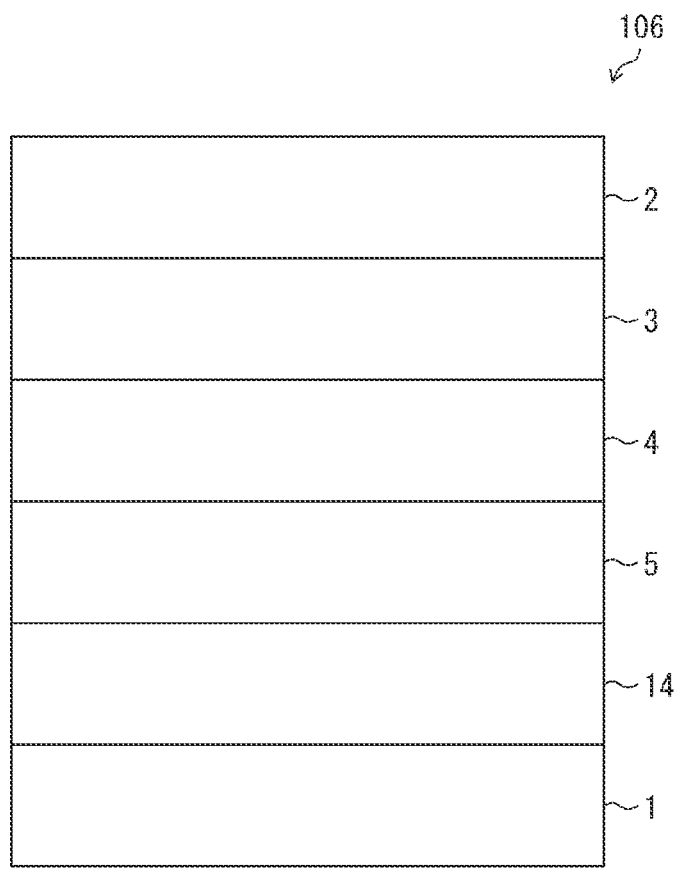
FIG. 8 is a schematic cross-sectional view of a structure of a light-emitting element in accordance with a variation example of Embodiment 3 of the disclosure.

FIG. 8 is a schematic cross-sectional view of a structure a light-emitting element 106 in accordance with a variation example of Embodiment 3 of the disclosure. The light-emitting element 106 includes the substrate 1, the first electrode 14, the electron transport layer 5, the light-emitting layer 4, the hole transport layer 3, and the second electrode 2, all of which are stacked in this order. In other words, when the light-emitting element 106 is compared with the light-emitting element 105 shown in FIG. 7, the order of stacking of the second electrode 2, the hole transport layer 3, the light-emitting layer 4, the electron transport layer 5, and the first electrode 14 on the substrate 1 is reversed.

In other words, in the light-emitting element 105, the order of stacking of the second electrode 2, the hole transport layer 3, the light-emitting layer 4, the electron transport layer 5, and the first electrode 14 may be reversed.

Other technical matters regarding the light-emitting element 106 can be explained by referring to technical matters regarding the light-emitting elements 101 to 105 when necessary.

Embodiment 4

Figure 9:
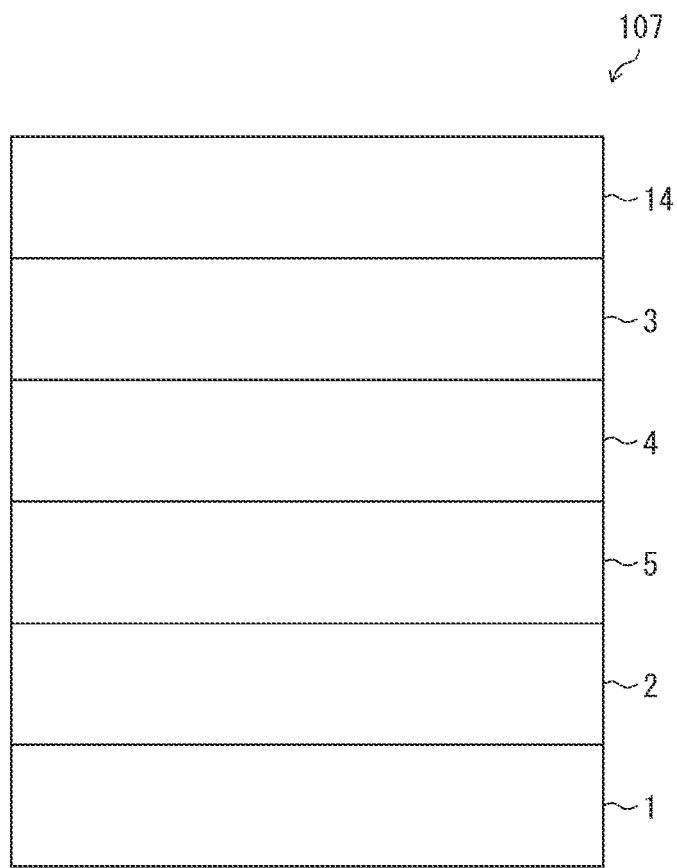
FIG. 9 is a schematic cross-sectional view of a structure of a light-emitting element in accordance with Embodiment 4 of the disclosure.

FIG. 9 is a schematic cross-sectional view of a structure of a light-emitting element 107 in accordance with Embodiment 4 of the disclosure. The light-emitting element 107 includes a substrate 1, a second electrode 2, an electron transport layer 5, a light-emitting layer 4, a hole transport layer (intervening layer, carrier transport layer) 3, and a first electrode 14, all of which are stacked in this order. In other words, the light-emitting element 107 has a structure in which the hole transport layer 3 and the electron transport layer 5 are transposed in the structure of the light-emitting element 105.

The hole transport layer 3 contains an oxide. The first electrode 14 is disposed on the hole transport layer 3. The hole transport layer 3 may be made of an inorganic oxide. In other words, the oxide contained in the hole transport layer 3 may be an inorganic oxide. The oxide contained in the hole transport layer 3 may be nanoparticles.

The first electrode 14 is made of an alloy or mixture that contains the first metal element and the second metal element which is more susceptible to oxidation than the first metal element.

The first metal element preferably contains any one of Au, Ag, and Cu. These materials have high reflectance to visible light. Therefore, the light extraction efficiency of the light-emitting element 107 can be increased by making up the first electrode 14 from any one of these materials. In addition, the most numerous metal atoms in those metal atoms which make up the first electrode 14 are more preferably atoms of the first metal element. This particular configuration can further increase the light extraction efficiency.

The second metal element is more susceptible to oxidation than the first metal element. Therefore, if the first electrode 14 is oxidized by the oxygen in the hole transport layer 3, the atoms of the second metal element are oxidized before the atoms of the first metal element. Oxidation of the atoms of the first metal element can be hence restrained.

This particular configuration can lower contact resistance between the first electrode 14 and the hole transport layer 3. In addition, if the first electrode 14 is light-reflective, the first electrode 14 can provide high reflectance. The first electrode 14 may be oxidized (may contain oxygen atoms) and may contain an oxide of the second metal element as a result of this oxidation. In contrast, the first electrode 14 contains atoms of the second metal element that is not oxidized. In the first electrode 14, the ratio of the number of oxygen atoms to the number of the atoms of the second metal element is preferably less than or equal to 30%, more preferably less than or equal to 10%, and even more preferably less than or equal to 5%. The smaller this ratio is, the better long-term reliability the first electrode 14 can provide. The ratio of the number of the atoms of the second metal element to the number of the atoms of the first metal element in the first electrode 14 is preferably from 0.1% to 30% both inclusive, more preferably from 0.2% to 10% both inclusive, and even more preferably from 1% to 5% both inclusive. The optical reflectance of the first electrode 14 could disadvantageously decrease if the ratio is too large, and the atoms of the first metal element are more susceptible to oxidation if the ratio is too small.

Examples of the second metal element include Bi, Pb, Ni, Co, Mo, Cd, Mn, Fe, W, Sn, Ge, In, Rb, Cs, Zn, K, Ga, Cr, Nb, Na, V, Ta, Si, Ti, Ce, Ba, Zr, Al, Hf, Sr, Li, La, Mg, Nd, Pr, Gd, Ca, Y, and Sc. Examples of the second metal element in the light-emitting element 107 differ from examples of the second metal element in the light-emitting elements 101 to 104 in that the former is highly reactive with air and/or contains a metal with a low melting point.

The second metal element may be, for example, Bi, Pb, Ni, Co, Mo, Cd, Mn, Fe, W, Sn, Ge, In, Zn, Ga, Cr, Nb, V, Ta, Si, Ti, Ce, Zr, Al, Hf, La, Mg, Nd, Pr, Gd, Y, or Sc.

The second metal element is more preferably more susceptible to oxidation than the first metal element and less susceptible to oxidation than the third metal element. Here, the second metal element reduces the oxide in the hole transport layer 3, which prevents deposition of the third metal element as an elementary substance, even if the light-emitting element 107 is subjected to harsh conditions such as a high-temperature thermal process or operation over an extended period of time. Therefore, the reliability of the light-emitting element 107 can be improved.

When the third metal element is Ni, and the first metal element is Ag, examples of the second metal element include Pd, Cu, Bi, and Pb.

The second metal element is preferably any of Ti, Zn, Sn, Ni, and In. This particular configuration ensures electrical conductivity even if most of the first electrode 14 is oxidized. The configuration can hence restrain, for example, increases in the resistance of the first electrode 14.

Note that the order of stacking from the electron transport layer 5 to the hole transport layer 3 may be reversed (a structure in which the electron transport layer 5 is in contact with the first electrode 14). Here, examples of the second metal element include Bi, Pb, Ni, Co, Mo, Cd, Mn, Fe, W, Sn, Ge, In, Zn, Ga, Cr, Nb, V, Ta, Si, Ti, Ce, Zr, Al, Hf, La, Mg, Nd, Pr, Gd, Y, and Sc.

Other technical matters regarding the light-emitting element 107 can be explained by referring to technical matters regarding the light-emitting elements 101 to 106 when necessary.

Figure 10:
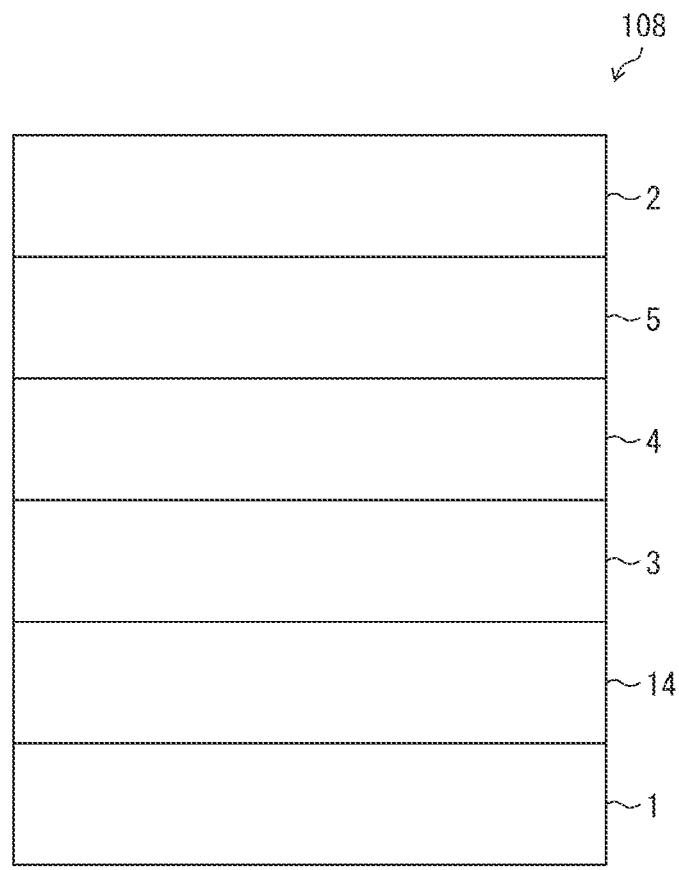
FIG. 10 is a schematic cross-sectional view of a structure of a light-emitting element in accordance with a variation example of Embodiment 4 of the disclosure.

FIG. 10 is a schematic cross-sectional view of a structure of a light-emitting element 108 in accordance with a variation example of Embodiment 4 of the disclosure. The light-emitting element 108 includes the substrate 1, the first electrode 14, the hole transport layer 3, the light-emitting layer 4, the electron transport layer 5, and the second electrode 2, all of which are stacked in this order. In other words, when the light-emitting element 108 is compared with the light-emitting element 107 shown in FIG. 9, the order of stacking of the second electrode 2, the electron transport layer 5, the light-emitting layer 4, the hole transport layer 3, and the first electrode 14 on the substrate 1 is reversed.

In other words, in the light-emitting element 107, the order of stacking of the second electrode 2, the electron transport layer 5, the light-emitting layer 4, the hole transport layer 3, and the first electrode 14 may be reversed.

Other technical matters regarding the light-emitting element 108 can be explained by referring to the technical matters regarding the light-emitting elements 101 to 107 when necessary.

Additional Remarks on Embodiments 1 to 4

The light-emitting layer 4 may include a quantum-dot fluorescent material (quantum dots). Here, the quantum-dot fluorescent material may contain sulfur as a component element thereof. If the quantum-dot fluorescent material contains sulfide, the light-emitting layer 4 may contain the sulfur atoms in the quantum-dot fluorescent material and/or the sulfur atoms that are a residue of a quantum-dot fluorescent material synthesis material. The second metal element is preferably more susceptible to sulfurization than the first metal element. Even if these sulfur atoms diffuse in the intervening layer and reach the first electrode, the atoms of the second metal element are sulfurized before the atoms of the first metal element, thereby preventing sulfurization of the atoms of the first metal element. Note that the intervening layer and the first electrode are not members that are common to all the light-emitting elements 101 to 108; reference should be made to the correspondence indicated in Embodiments 1 to 4.

The light-emitting layer 4 may contain intra-light-emitting-layer sulfur atoms, and the second metal element may be more susceptible to sulfurization than the first metal element. Intra-light-emitting-layer sulfur atoms refer to those sulfur atoms which are contained in the light-emitting layer 4. The sulfide in the second metal element may have a lower standard Gibbs energy of formation per 1 mol of sulfur atoms than the sulfide in the first metal element. Throughout the specification of the present application, "metal A being more susceptible to sulfurization than metal B" regarding two metals A and B means that the sulfide in metal A has a lower standard Gibbs energy of formation per 1 mol of sulfur atoms at some temperature than the sulfide in metal B. "Some temperature" refers to any temperature of, for example, from 25° C. to 300° C. both inclusive.

When the light-emitting layer 4 contains intra-light-emitting-layer sulfur atoms, and the second metal element is more susceptible to sulfurization than the first metal element, the light-emitting layer 4 may contain a quantum-dot fluorescent material, and the quantum-dot fluorescent material may contain at least some of the intra-light-emitting-layer sulfur atoms. The same description applies when the light-emitting layer 4 contains intra-light-emitting-layer sulfur atoms, and the sulfide in the second metal element has a lower standard Gibbs energy of formation per 1 mol of sulfur atoms than the sulfide in the first metal element. This assumes that the light-emitting layer 4 contains the intra-light-emitting-layer sulfur atoms as, for example, organic ligands, a starting material in the preparation of quantum dots, and a residue of a product produced in the preparation of quantum dots.

The first metal element may be Ag, and the second metal element may be any of Pb, Ge, Co, W, Mo, Si, Cd, Zn, Mn, and Mg. This can be described as a combination of materials of the second metal element being more susceptible to oxidation than the first metal element and the second metal element being more susceptible to sulfurization than the first metal element.

The oxide contained in the intervening layer may contain any of Zn, Ti, and Sr. This oxide may contain any of Ni, Cu, W, and Mo.

Embodiment 5

Figure 11:
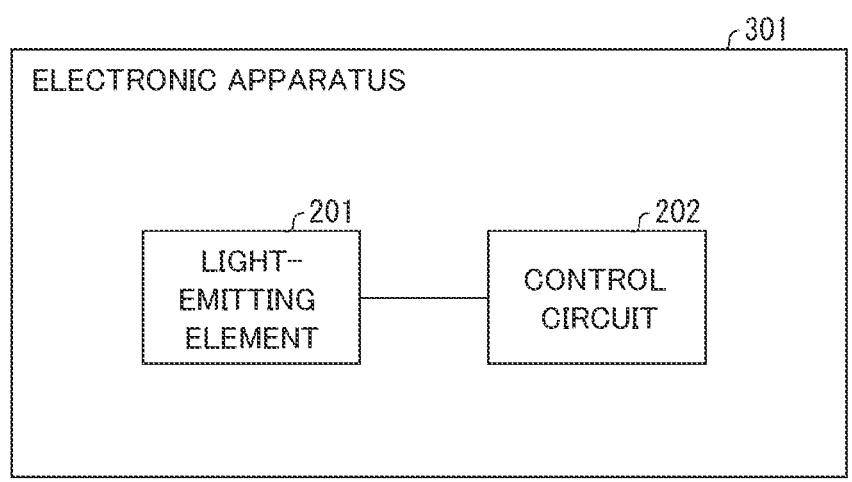
FIG. 11 is a schematic block diagram of a structure of an electronic apparatus in accordance with Embodiment 5 of the disclosure.

FIG. 11 is a schematic block diagram of a structure of an electronic apparatus 301 in accordance with Embodiment 5 of the disclosure. The electronic apparatus 301 includes: a light-emitting element 201; and a control circuit 202 for controlling emission of light by the light-emitting element 201.

The light-emitting element 201 is any of the aforementioned light-emitting elements 101 to 108. Control of the light-emitting element 201 by the control circuit 202 can be achieved by a well-known technique, and detailed description thereof is therefore omitted.

The electronic apparatus 301 may be, for example, a light-emitting device that outputs light based on the light emitted by the light-emitting element 201 or a display device that produces a display based on the light emitted by the light-emitting element 201.

General Description

The disclosure, in aspect 1 thereof, is directed to a light-emitting element including: a first electrode; a second electrode; a light-emitting layer between the first electrode and the second electrode; and an intervening layer between the first electrode and the light-emitting layer, the intervening layer containing an oxide, wherein the first electrode includes: a first layer adjacent to the intervening layer, the first layer containing atoms of a first metal element; and a second layer containing atoms of a second metal element, the first layer and the second layer are stacked in a stated order when viewed from the light-emitting layer, and the second metal element is more susceptible to oxidation than the first metal element.

In aspect 2 of the disclosure, the light-emitting element of aspect 1 is configured such that the intervening layer contains oxygen atoms in an end region on a first electrode side of the intervening layer and in an end region on a light-emitting layer side of the intervening layer.

In aspect 3 of the disclosure, the light-emitting element of aspect 1 is configured such that the intervening layer contains the oxide in an end region on a first electrode side of the intervening layer and in an end region on a light-emitting layer side of the intervening layer.

In aspect 4 of the disclosure, the light-emitting element of any one of aspects 1 to 3 is configured such that the intervening layer and the first layer are in contact with each other, and the first layer and the second layer are in contact with each other.

In aspect 5 of the disclosure, the light-emitting element of any one of aspects 1 to 4 is configured such that the oxide is an inorganic oxide.

In aspect 6 of the disclosure, the light-emitting element of any one of aspects 1 to 5 is configured such that the oxide is nanoparticles.

In aspect 7 of the disclosure, the light-emitting element of any one of aspects 1 to 6 is configured such that there is formed a crystal grain boundary in the first layer, and the first layer includes a crystal domain that has a dimension of from 50 nm to 800 nm both inclusive in a direction in which the intervening layer and the second layer are connected by a minimum distance.

In aspect 8 of the disclosure, the light-emitting element of aspect 7 is configured such that the dimension of the crystal domain in the direction in which the intervening layer and the second layer are connected by the minimum distance is from 100 nm to 500 nm both inclusive.

In aspect 9 of the disclosure, the light-emitting element of any one of aspects 1 to 8 is configured such that the oxide contains metal atoms that include more atoms of a third metal element than any other metal atoms, and the second metal element is less susceptible to oxidation than the third metal element.

In aspect 10 of the disclosure, the light-emitting element of any one of aspects 1 to 9 is configured such that the second layer contains atoms of the first metal element.

In aspect 11 of the disclosure, the light-emitting element of any one of aspects 1 to 10 is configured such that an oxide of the second metal element has a lower standard Gibbs energy of formation per 2 mol of oxygen atoms than an oxide of the first metal element.

In aspect 12 of the disclosure, the light-emitting element of any one of aspects 1 to 11 is configured such that an oxide of the second metal element has a standard Gibbs energy of formation greater than or equal to −1,000 kJ per 2 mol of oxygen atoms.

In aspect 13 of the disclosure, the light-emitting element of any one of aspects 1 to 12 is configured such that the first metal element is any of Au, Ag, and Cu.

In aspect 14 of the disclosure, the light-emitting element of any one of aspects 1 to 13 is configured such that the second metal element has a work function larger than 3.7 eV.

In aspect 15 of the disclosure, the light-emitting element of any one of aspects 1 to 14 is configured such that the second metal element has a work function greater than or equal to 4.0 eV.

In aspect 16 of the disclosure, the light-emitting element of any one of aspects 1 to 15 is configured such that the second metal element has a melting point higher than or equal to 160° C.

In aspect 17 of the disclosure, the light-emitting element of any one of aspects 1 to 10 is configured such that the second metal element is any of Bi, Pb, Ni, Co, Mo, Cd, Mn, Fe, W, Sn, Ge, In, Zn, Cr, Nb, V, Ta, Si, Ti, Ce, Zr, Al, Hf, Mg, Nd, Pr, Gd, Y, and Sc.

In aspect 18 of the disclosure, the light-emitting element of aspect 12 is configured such that the second metal element is any of Bi, Pb, Ni, Co, Mo, Cd, Mn, Fe, W, Sn, Ge, In, Zn, Cr, Nb, V, Ta, Si, and Ti.

In aspect 19 of the disclosure, the light-emitting element of aspect 14 is configured such that the second metal element is any of Bi, Pb, Ni, Co, Mo, Cd, Mn, Fe, W, Sn, Ge, In, Zn, Cr, Nb, V, Ta, Si, Ti, Zr, Al, and Hf.

In aspect 20 of the disclosure, the light-emitting element of any one of aspects 1 to 10 is configured such that the second metal element is any of Bi, Pb, Ni, Co, Mo, Cd, Mn, Fe, W, Sn, Ge, In, Cr, V, Ta, Si, Ti, Zr, and Al.

In aspect 21 of the disclosure, the light-emitting element of any one of aspects 1 to 10 is configured such that the second metal element is any of Bi, Pb, Ni, Co, Mo, Cd, Mn, Fe, W, Sn, Ge, Zn, Cr, Nb, V, Ta, Si, Ti, Ce, Zr, Al, Hf, Mg, Nd, Pr, Gd, Y, and Sc.

In aspect 22 of the disclosure, the light-emitting element of any one of aspects 1 to 10 is configured such that the second metal element is any of Bi, Pb, Ni, Co, Mo, Cd, Mn, Fe, W, Sn, Ge, Zn, Cr, Nb, V, Ta, Si, and Ti.

In aspect 23 of the disclosure, the light-emitting element of any one of aspects 1 to 10 is configured such that the second metal element is any of Ti, Zn, Sn, and Ni.

In aspect 24 of the disclosure, the light-emitting element of any one of aspects 1 to 23 is configured such that the first layer contains metal atoms that include more atoms of the first metal element than any other metal atoms.

In aspect 25 of the disclosure, the light-emitting element of any one of aspects 1 to 24 is configured such that the second layer contains metal atoms that include more atoms of the second metal element than any other metal atoms.

In aspect 26 of the disclosure, the light-emitting element of any one of aspects 1 to 25 is configured such that the second layer contains oxygen atoms.

In aspect 27 of the disclosure, the light-emitting element of aspect 26 is configured such that the second layer contains an oxide of the second metal element.

In aspect 28 of the disclosure, the light-emitting element of aspect 27 is configured such that the second layer contains the second metal element that is not oxidized.

In aspect 29 of the disclosure, the light-emitting element of any one of aspects 26 to 28 is configured such that the oxygen atoms in the second layer have a higher number density in an end region on an intervening layer side of the second layer than in a center of the second layer with respect to a thickness direction.

In aspect 30 of the disclosure, the light-emitting element of any one of aspects 26 to 29 is configured such that in the second layer, a ratio in number of the oxygen atoms to the atoms of the second metal element is less than or equal to 30%.

In aspect 31 of the disclosure, the light-emitting element of aspect 30 is configured such that the ratio is less than or equal to 10%.

In aspect 32 of the disclosure, the light-emitting element of aspect 30 is configured such that the ratio is less than or equal to 5%.

The disclosure, in aspect 33 thereof, is directed to a light-emitting element including: a first electrode; a second electrode; a light-emitting layer between the first electrode and the second electrode; and an intervening layer between the first electrode and the light-emitting layer, the intervening layer containing an oxide, wherein the first electrode is adjacent to the intervening layer, the first electrode contains either an alloy of the first metal element and the second metal element or a mixture of the first metal element and the second metal element, and the second metal element is more susceptible to oxidation than the first metal element.

In aspect 34 of the disclosure, the light-emitting element of aspect 33 is configured such that the intervening layer is a carrier transport layer.

In aspect 35 of the disclosure, the light-emitting element of aspect 33 or 34 is configured such that the oxide is an inorganic oxide.

In aspect 36 of the disclosure, the light-emitting element of any one of aspects 33 to 35 is configured such that the oxide is nanoparticles.

In aspect 37 of the disclosure, the light-emitting element of any one of aspects 33 to 36 is configured such that the first metal element is any of Au, Ag, and Cu.

In aspect 38 of the disclosure, the light-emitting element of any one of aspects 33 to 37 is configured such that the second metal element is any of Bi, Pb, Ni, Co, Mo, Cd, Mn, Fe, W, Sn, Ge, In, Rb, Cs, Zn, K, Ga, Cr, Nb, Na, V, Ta, Si, Ti, Ce, Ba, Zr, Al, Hf, Sr, Li, La, Mg, Nd, Pr, Gd, Ca, Y, and Sc.

In aspect 39 of the disclosure, the light-emitting element of any one of aspects 33 to 37 is configured such that the second metal element is any of Ti, Zn, Sn, Ni, and In.

In aspect 40 of the disclosure, the light-emitting element of any one of aspects 1 to 39 is configured such that the light-emitting layer contains quantum dots.

In aspect 41 of the disclosure, the light-emitting element of aspect 40 is configured such that the quantum dots contain sulfur as a component element.

In aspect 42 of the disclosure, the light-emitting element of any one of aspects 1 to 10 and 33 to 36 is configured such that the light-emitting layer contains intra-light-emitting-layer sulfur atoms, and the second metal element is more susceptible to sulfurization than the first metal element.

In aspect 43 of the disclosure, the light-emitting element of any one of aspects 1 to 10 and 33 to 36 is configured such that the light-emitting layer contains intra-light-emitting-layer sulfur atoms, and a sulfide of the second metal element has a lower standard Gibbs energy of formation per 1 mol of sulfur atoms than a sulfide of the first metal element.

In aspect 44 of the disclosure, the light-emitting element of aspect 42 or 43 is configured such that the light-emitting layer contains quantum dots, and the quantum dots contain at least some of the intra-light-emitting-layer sulfur atoms.

In aspect 45 of the disclosure, the light-emitting element of any one of aspects 42 to 44 is configured such that the first metal element is Ag, and the second metal element is any of Pb, Ge, Co, W, Mo, Si, Cd, Zn, Mn, and Mg.

In aspect 46 of the disclosure, the light-emitting element of any one of aspects 1 to 45 is configured such that the oxide contains any of Zn, Ti, and Sr.

In aspect 47 of the disclosure, the light-emitting element of any one of aspects 1 to 45 is configured such that the oxide contains any of Ni, Cu, W, and Mo.

The disclosure, in aspect 48 thereof, is directed to a light-emitting device including: the light-emitting element of any one of aspects 1 to 47; and a control circuit configured to control emission of light by the light-emitting element.

The disclosure, in aspect 49 thereof, is directed to a display device including: the light-emitting element of any one of aspects 1 to 47; and a control circuit configured to control emission of light by the light-emitting element.

The disclosure is not limited to the description of the embodiments above and may be altered within the scope of the claims. Embodiments based on a proper combination of technical means disclosed in different embodiments are encompassed in the technical scope of the disclosure. Furthermore, new technological features can be created by combining different technical means disclosed in the embodiments.

The invention claimed is:
1. A light-emitting element comprising:
a first electrode;
a second electrode;
a light-emitting layer between the first electrode and the second electrode; and
an intervening layer between the first electrode and the light-emitting layer, the intervening layer containing an oxide, wherein
the first electrode includes:
a first layer adjacent to the intervening layer, the first layer containing atoms of a first metal element; and
a second layer containing atoms of a second metal element,
the first layer and the second layer are stacked in a stated order when viewed from the light-emitting layer, and
the second metal element is more susceptible to oxidation than the first metal element, wherein
there is formed a crystal grain boundary in the first layer, and
the first layer includes a crystal domain that has a dimension of from 50 nm to 800 nm both inclusive in a direction in which the intervening layer and the second layer are connected by a minimum distance.

2. The light-emitting element according to claim 1, wherein the intervening layer contains oxygen atoms in an end region on a first electrode side of the intervening layer and in an end region on a light-emitting layer side of the intervening layer.

3. The light-emitting element according to claim 1, wherein the intervening layer contains the oxide in an end region on a first electrode side of the intervening layer and in an end region on a light-emitting layer side of the intervening layer.

4. The light-emitting element according to claim 1, wherein
the intervening layer and the first layer are in contact with each other, and
the first layer and the second layer are in contact with each other.

5. The light-emitting element according to claim 1, wherein the oxide is an inorganic oxide.

6. The light-emitting element according to claim 1, wherein the dimension of the crystal domain in the direction in which the intervening layer and the second layer are connected by the minimum distance is from 100 nm to 500 nm both inclusive.

7. The light-emitting element according to claim 1, wherein
the oxide contains metal atoms that include more atoms of a third metal element than any other metal atoms, and
the second metal element is less susceptible to oxidation than the third metal element.

8. The light-emitting element according to claim 1, wherein the second layer contains atoms of the first metal element.

9. The light-emitting element according to claim 1, wherein the first metal element is any of Au, Ag, and Cu.

10. The light-emitting element according to claim 1, wherein the second metal element is any of Bi, Pb, Ni, Co, Mo, Cd, Mn, Fe, W, Sn, Ge, In, Zn, Cr, Nb, V, Ta, Si, Ti, Ce, Zr, Al, Hf, Mg, Nd, Pr, Gd, Y, and Sc.

11. The light-emitting element according to claim 1, wherein the second metal element is any of Ti, Zn, Sn, and Ni.

12. The light-emitting element according to claim 1, wherein the first layer contains metal atoms that include more atoms of the first metal element than any other metal atoms.

13. The light-emitting element according to claim 1, wherein the second layer contains metal atoms that include more atoms of the second metal element than any other metal atoms.

14. The light-emitting element according to claim 1, wherein the second layer contains oxygen atoms.

15. The light-emitting element according to claim 1, wherein the second layer contains an oxide of the second metal element.

16. The light-emitting element according to claim 1, wherein
the second layer contains oxygen atoms, and
the oxygen atoms in the second layer have a higher number density in an end region on an intervening layer side of the second layer than in a center of the second layer with respect to a thickness direction.

17. The light-emitting element according to claim 1, wherein
the second layer contains oxygen atoms, and
in the second layer, a ratio in number of the oxygen atoms to the atoms of the second metal element is less than or equal to 30%.

18. The light-emitting element according to claim 1, wherein
the light-emitting layer contains intra-light-emitting-layer sulfur atoms, and
the second metal element is more susceptible to sulfurization than the first metal element.

19. A light-emitting element comprising:
a first electrode;
a second electrode;
a light-emitting layer between the first electrode and the second electrode; and
an intervening layer between the first electrode and the light-emitting layer, the intervening layer containing an oxide, wherein
the first electrode is adjacent to the intervening layer,
the first electrode contains either an alloy of the first metal element and the second metal element or a mixture of the first metal element and the second metal element,
the second metal element is more susceptible to oxidation than the first metal element,
the first electrode contains oxygen atoms,
in the first electrode, a ratio in number of the oxygen atoms to the atoms of the second metal element is less than or equal to 30%, and
the ratio of the number of the atoms of the second metal element to the number of the atoms of the first metal element in the first electrode is from 0.1% to 30% both inclusive.

* * * * *